United States Patent [19]

Takahashi et al.

[11] Patent Number: 5,753,380

[45] Date of Patent: *May 19, 1998

[54] HIGH PURITY ALUMINUM ALLOY CONDUCTOR FOR USE AT ULTRA LOW TEMPERATURES

[75] Inventors: Akihiko Takahashi, Ryugasaki; Hitoshi Yasuda, Tsukuba, both of Japan; Karl Theodore Hartwig, College Station; Lacy Clark McDonald, Bryan, both of Tex.

[73] Assignees: Sumitomo Chemical Co., Ltd., Osaka, Japan; The Texas A&M University System, College Station, Tex.

[*] Notice: The term of this patent shall not extend beyond the expiration date of Pat. No. 5,573,861.

[21] Appl. No.: 441,836

[22] Filed: May 16, 1995

Related U.S. Application Data

[63] Continuation-in-part of Ser. No. 86,920, Jul. 7, 1993, abandoned.

[51] Int. Cl.⁶ .................................................. H01B 12/12
[52] U.S. Cl. .................. 428/651; 428/930; 174/125.1; 148/535; 505/812; 335/216
[58] Field of Search ............................. 148/562, 404, 148/535; 420/528, 529, 531–534, 536–537, 540–542, 546, 548–549, 554; 156/DIG. 61; 174/125.1, 202; 428/930, 632, 657; 335/216; 505/812, 814

[56] References Cited

U.S. PATENT DOCUMENTS

| | | | |
|---|---|---|---|
| 3,211,547 | 10/1965 | Jarreh et al. | 156/DIG. 61 |
| 3,997,339 | 12/1976 | Fickelscher | 420/528 |
| 4,166,755 | 9/1979 | Fister et al. | 420/529 |
| 4,213,800 | 7/1980 | Mayo et al. | 420/537 |
| 4,537,642 | 8/1985 | Saito et al. | 29/599 |
| 4,581,289 | 4/1986 | Dietrich et al. | 428/930 |
| 4,609,408 | 9/1986 | Rodrigues et al. | 148/552 |
| 4,659,007 | 4/1987 | Onishi et al. | 29/599 |
| 4,711,825 | 12/1987 | Oberly et al. | |
| 5,189,386 | 2/1993 | Tada et al. | 428/651 |
| 5,266,416 | 11/1993 | Inoue et al. | 428/651 |
| 5,456,815 | 10/1995 | Fukuyo et al. | 204/298.13 |
| 5,466,312 | 11/1995 | Ward et al. | 148/552 |

FOREIGN PATENT DOCUMENTS

| | | |
|---|---|---|
| 4423540 | 1/1995 | Germany . |
| 56-136959 | 10/1981 | Japan . |
| 57-057856 | 4/1982 | Japan . |
| 59-056560 | 4/1984 | Japan .................. 420/528 |
| 59-064754 | 4/1984 | Japan . |
| 60-155655 | 8/1985 | Japan . |
| 61-243159 | 10/1986 | Japan . |
| 63-224804 | 9/1988 | Japan . |
| 2-066141 | 3/1990 | Japan . |
| 5-287465 | 11/1993 | Japan . |

OTHER PUBLICATIONS

Niclescu et al., "Aluminum for Cryoelectrotechnics", Institute of Electrical Engineers, Stevenage, GB, Inspec. No. 1730206, Studii Si Cercetari De Fizica, 1980, Romania, vol. 32, No. 8 –Abstract.

Takeo Fujinara and Kunio Yamasaki "A Method of Producing A Long Single Crystal Plate of Aluminum with any Desired Crystallographic Plane", pp. 89–921, 939, 1941.

Woldman's Engineering Alloys, 6th Ed. p. 1764 1979.

Metals Handbook, 9th Ed vol. 15 pp. 319–323, 1988.

Superconducting magnetic energy Storage (SMES), vol. 1: Basic R&D 1984–1985, Section 4, Parts A & B, pp. 4–1 through 4–99, Electric Power Research Institute, Research Project 2572-2 (Final Report, Nov. 1990).

ASM Handbook vol. 2, p.1096, Apr. 1996 TA 459 M43 in Stic.

Robert E. Green, Jr. and Norman L. Newbem, "Continuous Growth of Single Crystal Aluminum Wires from the Melt", Transactions of the Metallurgical Society of Aime, Apr. 1962, vol. 224, New York, NY, USA, pp. 398–399.

P. Albert, O. Dimitrov and J. Le hericy, "Etude de la recristallisation de l'aluminium de tres haute purete et de son influence sur la conductibilite electrique aux basses temperatures", Revue de Matallurgie, 1957, vol. 54, Paris, France, pp. 931–941.

*Primary Examiner*—Margery Phipps
*Attorney, Agent, or Firm*—Cushman Darby & Cushman IP Group of Pillsbury Madison & Sutro LLP

[57] ABSTRACT

The present invention concerns an aluminum alloy conductor of a cryostatic stabilizer for use at ultra low temperatures of 30° K. or lower which is provided on and around a superconductor. The aluminum alloy conductor is made of 6 to 200 weight ppm of at least one element selected from the group of metallic and semimetallic effective elements consisting of B, Ca, Ce, Ga, Y, Yb and Th, and aluminum and inevitable impurities. The aluminum alloy conductor is obtained by adding at least one of these elements into a high purity aluminum whose purity is at least 99.98 wt. %. The aluminum alloy conductor has a 0.2% proof strength of not greater than 2.6 Kg/mm².

11 Claims, No Drawings

HIGH PURITY ALUMINUM ALLOY CONDUCTOR FOR USE AT ULTRA LOW TEMPERATURES

This application is a Continuation-In-Part Application of U.S. patent application Ser. No. 08/086,920 filed on Jul. 7, 1993, now abandoned the complete disclosure of which is herein incorporated by reference.

FIELD OF THE INVENTION

The present invention relates to an aluminum alloy conductor for use at ultra low temperature of 30° K. or lower and a production process thereof. The aluminum alloy can be used under conditions where cyclic strain is applied at ultra low temperatures.

TECHNICAL BACKGROUND AND PRIOR ART

In those facilities and equipment which utilize a superconductor, a conductor, generally called a cryostatic stabilizer, is provided on and around the superconductor to protect the superconductor by by-passing the electric current to the aluminum conductor around the superconductor region in the state of normal conductivity which occurs due to an external thermal, electric or magnetic disturbance.

The transition from the state of superconductivity to the state of normal conductivity, which is usually called "QUENCHING", results in current flow and $I^2R$ heat generation (wherein I means electric current and R means resistance of the conductor) in the region of the high purity aluminum.

High purity aluminum, because its electric resistivity is remarkably low at ultra low temperatures and in a magnetic field, has been discussed for possible use as such a cryostatic stabilizer, F. R. Fickett, "Magnetro-resistance of Very Pure Polycrystalline Aluminum", Phy. Rev. B. Vol. 3, No. 6, 1971, p. 1941. "Superconducting Magnetic Energy Storage" Vol. 1: Basic R&D 1984–85, EPRI GS-7053, published by the Electric Power Research Institute in Nov. 1990.

The use of a cryostatic stabilizer made of high purity aluminum is planned for Superconducting Magnetic Energy Storage (SMES) devices. In such facilities which store large quantities of electric power, hoop stresses are caused by the current flow through the magnet, and when electric charging and discharging are repeated, cyclic tensile stress and compressive stress may be applied repeatedly to the superconductor and the cryostatic stabilizer.

It is known that such cyclic stress, which can include a plastic strain component at ultra low temperature, applies an adverse influence on high purity aluminum at ultra low temperature in the form of an increase in electric resistivity. Advances in Cryogenic Engineering. 22, 486–489 (1976).

Therefore, for those applications in which cyclic strain is applied at ultra low temperature to the cryostatic stabilizer of high purity aluminum, the high purity aluminum conductor component should be of a relatively larger cross section in view of a possible increase in electric resistance of the cryostatic stabilizer when in use, or the conductor should be so designed as to reduce plastic strain of the cryostatic stabilizer under the same stress by increasing the design strength of the structural materials of SMES.

However, the above countermeasures require a large amount of materials when adopted for such large structures as utility scale SMES and are therefore very costly.

Further, it is known in the report International Conference on Cryogenic materials, Applications and Properties, Shenyang, people's Republic of China, Jun. 7–10, 1988 that a high purity aluminum conductor used at ultra low temperature and its electric resistivity under cyclic strain does not remain low enough for the stabilizer if the cyclic strain range is too high. Table 3 of above report shows that at 4.2° K. resistivity is 0.58 nΩcm before strain and 9.70 nΩm after 3000 cycles of strain at ±0.1%.

SUMMARY OF THE INVENTION

An objective of the present invention is to provide a high purity aluminum conductor that can be used at ultra low temperature.

A further object of the invention is provide a high purity aluminum conductor having a reduced residual stress.

Another objective of the present invention is to provide a production process for the aluminum conductor in which the increase of its electric resistivity is minimized, ie. kept small, under conditions where cyclic strain is applied at ultra low temperatures.

A further object of the invention is provide a production process for producing a high purity aluminum conductor having a reduced residual stress on the surface thereof.

The present inventors made thorough studies regarding the development of the high purity aluminum conductor which an increase in electric resistivity at ultra low temperature is minimized even after cyclic strain is applied at ultra low temperature.

We have discovered that as a result, a high purity aluminum conductor with a purity of 99.98 to 99.9999 wt %, preferably 99.995 to 99.9999 wt %, containing at least one of metallic and semimetallic effective elements, has the increase of its electric resistivity minimized under those conditions where cyclic strain is applied at ultra low temperatures, and in addition, that the control of crystal orientation after the addition of the effective elements to the high purity aluminum conductor in which the increase of electric resistivity is even smaller.

We have also discovered that by controlling the crystal structure of the high purity aluminum conductor so as to consist of (i) a single crystal which has a specific crystal axis of <111> or <100>, or within an angle range of not greater than 10° in relation to the <111> or <100> axis in the longitudinal direction of the aluminum conductor, or (ii) a polycrystal most of which crystal grains have respective specific crystal axes, namely the <111> and/or <100> axes and/or the axes within an angle range of not greater than 10° in relation to the <111> or <100> axis, in the longitudinal direction of the aluminum conductor, and have specific crystal grain size, namely the mean crystal grain size is between 0.01 mm and 3.0 mm, the increase of electric resistance of the aluminum conductor can be minimized at ultra low temperatures even after longitudinal cyclic strain is applied at ultra low temperatures.

DETAILED DESCRIPTION OF THE INVENTION

The invention is achieved by adding at least one effective element to high purity aluminum where purity is not less than 99.98 wt %, preferably not less than 99.995 wt %. Though higher purity is preferable, high purity aluminum with purity up to 99.9999 wt % can be used practically. The weight percentage of purity is calculated by the subtraction of Fe, Si and other metallic and nonmetallic elements, which are inevitably contained in high purity aluminum. Gases such as oxygen, hydrogen and chlorine may be neglected in the account of the purity.

In aluminum with a purity of less than 99.98 wt %, there is inevitably contained high levels of impurities, such as iron which increases electric resistivity. If the effective elements are added in addition to such an amount of impurities, the high purity aluminum conductor becomes much less desirable because resistivity of the conductor becomes too high, even though the conductor has the increase of its electric resistivity minimized under those conditions where cyclic strain is applied at ultra low temperatures.

The additive effective elements should be those which have the increase of electric resistivity of high purity aluminum minimized in room temperature, which atomic radius is largely different from that of aluminum, and which solid solubility into high purity aluminum is large and thus segregation is small during solidification, making the added elements work more effectively and the industrial worth greater.

Single or combined metallic or nonmetallic elements such as Ti, V, Cr, Mn, Fe, Co, Ni, Zr, Nb, Mo, Tc, Ru, Rh, Pd, Hf, Ta, W, Re, Os, Ir and Pt are not effective, because they cause a large increase in the electric resistivity of high purity aluminum at room temperature.

Other metallic and semimetallic elements except for the above mentioned elements are effective. Much more effective elements are Li, Na, Be, Mg, Ca, Y, Cu, Zn, B, Ga, Si, Ge, Pb, Bi, Lanthanide and Actinide. It is more preferable to use effective elements with at least one selected from the group consisting of B, Ca, Ce, Ga, Y, Yb and Th. Additions of less than 6 weight ppm of the additive elements is not effective. Not less than six weight ppm is preferable and ten weight ppm or greater is more preferable. Although more than 200 weight ppm are effective, the electric resistivity before the cyclic strain test is higher. The total amount of the additive elements and impurities which are inevitably contained in high purity aluminum is preferably less than 200 weight ppm.

To make the high purity aluminum conductor containing the effective elements, the elements are added in a molten high purity aluminum by a conventional method. The molten aluminum metal is cast into a thick bar and shaped into a conductor by plastic working, such as conventional working methods of extrusion, drawing and rolling, or continuous casting into a thin conductor directly.

Because the amount of the additive effective elements are less than 200 weight ppm, most of those are in the state of solid solution at solidification and some are segregated in the cast blocks.

A homogenization treatment of the conductor, to reduce the segregation, at 450° to 650° C. for ten minutes to twenty hours is effective to enhance effects of the added elements. Also, a heat treatment of the conductor after the addition of the effective elements and optional homogenization treatment and optional plastic working of the thick bar are effective to enhance the effects of the additive elements. The heat treatment makes the additive elements attach to grain boundaries, subgrain boundaries and dislocation substructures inside the above processed high purity aluminum. The homogenization and the heat treatment are effective individually and the combination of the homogenization and the following heat treatment are more effective. The heat, needed for or developed during extrusion or the roll working process can also be used effectively as the heat treatment. The heat at soldering of a superconductor to attach the cryostatic stabilizer can also be used. The preferable conditions for the heat treatment is to maintain at 250° to 530° C. for 3 to 120 minutes. The heat treatment reduces the residual stresses from the conductor. Furthermore, the heat treatment results in a high purity aluminum conductor (a single crystal structure) having a 0.2% proof strength of up to 2.6 Kg/mm$^2$ or a high purity aluminum conductor (not a single crystal structure) having a 0.2% proof strength of up to 2.0 Kg/mm$^2$, as shown in Table 3.

Furthermore, the inventors have found that a specific crystal orientation of the high purity aluminum conductor causes the increase of electric resistivity to be minimized even after cyclic strain is applied at ultra low temperatures. This means that the control of crystal orientation of the high purity aluminum conductor containing the additive effective elements further reduces the increase of electric resistivity.

Much more effective results are obtained by adding effective elements to the aluminum conductor consisting of a veritable single crystal or a substantially single crystal which has a specific crystal axis of <100> or <111>, within an angle range of not greater than 10° in relation to the <100> or <111> axis in the longitudinal direction of the aluminum conductor.

The same effective results are obtained by adding effective elements to the aluminum conductor consisting of a polycrystal most of which crystal grains have specific crystal axes, namely the <111> and/or <100> axis and/or the crystal axes within an angle range of not greater than 10° in relation to the <111> or <100> axis with respect to each grain, in the longitudinal direction of the aluminum conductor.

As is evident from Tables 1 and 2, after cyclic strain is applied 3,000 times at ultra low temperatures, the high purity aluminum in the invention has lower electric resistivity in liquid helium than the aluminum used in the comparative example and the aluminum aforementioned in the last paragraph of "TECHNICAL BACKGROUND AND PRIOR ART". Thus, the high purity aluminum in the invention has excellent characteristics as a cryostatic stabilizer used at ultra low temperature.

Here, regarding the crystal structure of the high purity aluminum, a detailed description is provided as follows.

A veritable single crystal can be produced by the method of strain anneal crystal growth. The Bridgeman method, Chalmers method or Czochralski method, which uses an oriented seed crystal, can be adopted for obtaining an aluminum conductor consisting of a substantially single crystal which has the <111> or <100> axis, or the crystal axes within an angle range of not greater than 10° in relation to the <111> or <100> axis in the longitudinal direction of the aluminum conductor. A very low speed particular continuous casting method can be adopted for obtaining an aluminum conductor consisting of the substantially single crystal.

A polycrystal made of a bundle of grains each of which is rather columnar and is almost as long as the length of the aluminum conductor in the longitudinal directions of the conductor has the same effects as the substantially single crystal, and which has the specific and effective orientation mentioned above. The same low speed particular continuous casting method can be adopted for obtaining such a bundle of grains.

A polycrystal, consisting of very coarse crystal grains, each of which is (i) as long as the diameter of the aluminum conductor in the lateral direction of the conductor and is (ii) lined one after another in the longitudinal direction of the conductor, and most of which grains have the <111> and/or <100> axis and/or the crystal axes within an angle range of not greater than 10° in relation to the <111> or <100> axis, respectively, in the longitudinal direction of the conductor, can work in a manner similar to the single crystal mentioned above as a high purity aluminum conductor for use at ultra low temperature in the invention.

Further, an aluminum conductor consisting of a polycrystal, most of which crystal grains have the <111> and/or <111> axis and/or the crystal axes within an angle range of not greater than 10° in relation to the <111> or <100> axis, respectively, in the longitudinal direction of the aluminum conductor and have mean grain size between 0.01 mm and 3.0 mm, preferably 0.01 to 2.0 mm, also works effectively as a high purity aluminum used at ultra low temperature in this invention. An extrusion crystal texture or re-crystallized texture is suitable for such a polycrystal. In this invention, such extrusion crystal, texture or re-crystallized texture can be obtained by extrusion working of high purity aluminum at 150° C. to 350° C. and in area reduction ratio of 1/10 to 1/150, preferably 1/20 to 1/100, optionally cooling it to room temperature, subsequently heating it up to a temperature range of from 250° C. to 530° C. and holding it at the temperature for 10 min. to 120 min.

The invention will be explained by the following non-limiting example.

EXAMPLE

B, Ca, Ce, Ga or Y were added respectively, as shown in Table 1, to high purity aluminum of 99.9998 wt % which was melted and kept at 750° C. The molten aluminum metal was cast into a graphite mold with a size of 65×35×120 mm. The cast block was homogenized at 600° C. for ten hours, rolled to make a plate with a thickness of 14 mm and finally annealed at 350° C. for ten minutes. The sample rods of 10 mm in diameter and 150 mm in length, which were obtained by machining from the thick plate, were heated at 250° C. for two hours and the residual stresses (from machining) were released from their surfaces. Then, the samples were soaked, with jigs into liquid helium, and those electric resistivities were measured at 4.2° K. of ultra low temperature by the eddy current decay method.

Further, the 150 mm length samples were given 0.1% tensile strain and compressive strain 3,000 times with the temperature kept at 4.2° K., thereafter the electric resistivity were measured in the liquid helium by the eddy current decay method in the same manner as mentioned in the above paragraph. The results are shown in Table 1.

TABLE 1

| Additive element | Amount (wt. ppm) | Residual electric resistivity at 4.2° K. (nΩcm) | |
|---|---|---|---|
| | | Before strain | After 3,000 cycles of ±0.1% strain at 4.2° K. |
| B | 20 | 0.45 | 6.23 |
| B | 70 | 0.62 | 6.49 |
| Ca | 20 | 0.36 | 6.07 |
| Ce | 20 | 0.34 | 5.85 |
| Ce | 90 | 0.41 | 6.03 |
| Ga | 20 | 0.55 | 6.21 |
| Y | 20 | 0.72 | 6.74 |

COMPARATIVE EXAMPLE

Test pieces were made in the same manner as mentioned in example 1 except that the amount of added elements was 5 weight ppm respectively, and the results are shown in Table 2.

TABLE 2

| Additive element | Amount (wt. ppm) | Residual electric resistivity at 4.2° K. (nΩcm) | |
|---|---|---|---|
| | | Before strain | After 3,000 cycles of ±0.1% strain at 4.2° K. |
| B | 5 | 0.29 | 7.76 |
| Ca | 5 | 0.41 | 8.05 |
| Ga | 5 | 0.28 | 7.40 |
| Y | 5 | 0.44 | 8.00 |

0.2% Proof Strength:

With regard to some of the samples of the aforementioned Examples, 0.2% proof strength was also determined as shown in Table 3. The load at 0.1% tensile strain and 0.1% flow stress was measured for each of the samples. The data was obtained digitally and is accurate to within ±2%. The data for 0.2% proof strength was then calculated by measuring the slope of the plastic region on each analog plot of load versus strain. The load at a strain of 0.2% was then extrapolated and used to estimate the 0.2% proof strength. The units of Kg/mm² were obtained by converting from MPa using a factor of 0.102 kgf/N. Extrapolated data are accurate to within ±5%.

As is evident from the data presented in Table 3, the aluminum alloy of the invention, in non-single crystal form, can have a 0.2% proof strength of up to 2.0 Kg/mm².

TABLE 3

| | Additive Element | Amount (wt ppm) | Load at 0.1% Strain (lbs) | 0.1% Flow Stress (MPa) | Estimated 0.2% Flow Stress (MPa) | Estimated 0.2% Proof Strength (kg/mm$_2$) |
|---|---|---|---|---|---|---|
| Example | B | 20 | 171 | 9.7 | 12.1 | 1.23 |
| | B | 70 | 197 | 11.1 | 13.9 | 1.42 |
| | Ca | 20 | 212 | 12 | 14.4 | 1.47 |
| | Ce | 20 | 195 | 11 | 13.7 | 1.4 |
| | Ce | 90 | 263 | 15 | 17.7 | 1.8 |
| | Y | 20 | 237 | 13.4 | 16 | 1.63 |

TABLE 3-continued

|  | Additive Element | Amount (wt ppm) | Load at 0.1% Strain (lbs) | 0.1% Flow Stress (MPa) | Estimated 0.2% Flow Stress (MPa) | Estimated 0.2% Proof Strength (kg/mm$_2$) |
| --- | --- | --- | --- | --- | --- | --- |
| Comparative Example | B | 5 | 196 | 10.8 | 13.2 | 1.35 |
|  | Ca | 5 | 208 | 11.8 | 14.2 | 1.45 |
|  | Ga | 5 | 184 | 10.4 | 12.4 | 1.27 |
|  | Y | 5 | 246 | 14 | 16.7 | 1.71 |

What is claimed is:

1. An aluminum alloy conductor of a cryostatic stabilizer used at ultra low temperature of 30° K. or lower which is provided on and around a superconductor, consisting of:

6 to 200 weight ppm of at least one element selected from the group of metallic and semimetallic effective elements consisting of B, Ca, Ga, Y, Yb and Th; and aluminum and inevitable impurities, wherein said aluminum alloy conductor is obtained by adding at least one of said elements into a high purity aluminum whose purity is at least 99.98 wt. %, and wherein said aluminum alloy conductor has a 0.2% proof strength of not greater than 2.6 Kg/mm$^2$.

2. An aluminum alloy conductor according to claim 1, wherein said high purity aluminum has a purity of 99.98 to 99.9999 wt. % and the aluminum alloy conductor consists of a veritable single crystal or a substantially single crystal which has a specific crystal axis of <100> or <111>, or an angle range of not greater than 10° in relation to the <100> or <111> axis respectively, in the longitudinal direction of the aluminum alloy conductor.

3. An aluminum alloy conductor according to claim 1, wherein said high purity aluminum has a purity of 99.98 to 99.9999 wt. % and the aluminum alloy conductor consists of a polycrystal in which most of the grains have any one of specific crystal axis of <111>, <100>, or both <111> and <100>, and within an angle range of not greater than 10° in relation to any one of said <111> and <100> axis, respectively, with respect to each grain in the longitudinal direction of the aluminum alloy conductor.

4. An aluminum alloy conductor according to claim 1, wherein said aluminum alloy conductor contains said at least one element of said elements in an amount of 10 to 200 weight ppm.

5. An aluminum alloy conductor according to claim 1, wherein said aluminum alloy conductor has a 0.2% proof strength of not greater than 2.0 Kg/mm$^2$.

6. An aluminum alloy conductor of a cryostatic stabilizer used at ultra low temperature of 30° K. or lower which is provided on and around a superconductor, consisting of:

6 to 200 weight ppm of at least one element selected from the group of metallic and semimetallic effective elements consisting of B, Ca, Ga, Y, Yb and Th; and aluminum and inevitable impurities, wherein said aluminum alloy conductor is obtained by adding said at least one of said elements into a high purity aluminum whose purity is at least 99.98 wt. %, and wherein said aluminum alloy conductor has been subjected to a heat treatment at 250° C. to 530° C. for 3 to 120 minutes by which residual stress in the aluminum is relieved.

7. An aluminum alloy conductor according to claim 6, wherein said aluminum alloy conductor has a 0.2% proof strength of not greater than 2.6 Kg/mm$^2$.

8. An aluminum alloy conductor according to claim 6, wherein said aluminum alloy conductor has a 0.2% proof strength of not greater than 2.0 Kg/mm$^2$.

9. An aluminum alloy conductor according to claim 6, wherein said high purity aluminum has a purity of 99.98 to 99.9999 wt. % and the aluminum alloy conductor consists of a veritable single crystal or a substantially single crystal which has a specific crystal axis of <100> or <111>, or an angle range of not greater than 10° in relation to the <100> or <111> axis respectively, in the longitudinal direction of the aluminum alloy conductor.

10. An aluminum alloy conductor according to claim 6, wherein said high purity aluminum has a purity of 99.98 to 99.9999 wt. % and the aluminum alloy conductor consists of a polycrystal in which most of the grains have any one of specific crystal axis of <111>, <100>, or both <111> and <100>, and within an angle range of not greater than 10° in relation to any one of said <111> and <100> axis, respectively, with respect to each grain in the longitudinal direction of the aluminum alloy conductor.

11. An aluminum alloy conductor according to claim 6, wherein said aluminum alloy conductor contains said at least one element of said elements in an amount of 10 to 200 weight ppm.

* * * * *